United States Patent [19]

Niskala

[11] Patent Number: 4,799,854
[45] Date of Patent: Jan. 24, 1989

[54] ROTATABLE PICK AND PLACE VACUUM SENSE HEAD FOR DIE BONDING APPARATUS

[75] Inventor: Gary G. Niskala, Garden Grove, Calif.

[73] Assignee: Hughes Aircraft Company, Los Angeles, Calif.

[21] Appl. No.: 75,157

[22] Filed: Jul. 20, 1987

[51] Int. Cl.$^4$ ............................................. B66C 1/02
[52] U.S. Cl. ....................................... 414/737; 29/568; 414/912; 901/40; 294/64.1
[58] Field of Search ....................... 901/41, 40, 31, 30, 901/14; 414/737, 752, 744 B, 912; 29/568; 294/64.1; 285/351

[56] References Cited

U.S. PATENT DOCUMENTS

| | | | |
|---|---|---|---|
| Re. 32,538 | 11/1987 | Hawkswell | 414/226 X |
| 4,135,630 | 1/1979 | Snyder et al. | 294/64.1 X |
| 4,515,507 | 5/1985 | Asai et al. | 414/744 B X |
| 4,604,787 | 8/1986 | Sievers, Jr. | 29/568 |
| 4,611,397 | 9/1986 | Janisiewicz et al. | 294/2 X |
| 4,611,846 | 9/1986 | Feiber et al. | 414/737 X |
| 4,620,362 | 11/1986 | Reynolds | 901/30 X |
| 4,635,328 | 1/1987 | Palmer | 901/41 X |
| 4,723,353 | 2/1988 | Monforte | 414/737 X |

*Primary Examiner*—Robert J. Spar
*Assistant Examiner*—William M. Hienz
*Attorney, Agent, or Firm*—Kenneth W. Float; Terje Gudmestad; A. W. Karambelas

[57] ABSTRACT

A pick and place head for transferring die or chips containing electronic circuitry from waffle packs to substrates prior to lead bonding operations. The pick and place head includes a spindle rotatably mounted at the end of an arm and carrying jaws which are extendable to grasp, retract and rotate a collet having a vacuum pickup tip. Embodied as part of the spindle is a vacuum sensor manifold which sealably receives the collet and cooperates with it to form part of a vacuum sensing system to detect pickup of the chip or die.

27 Claims, 5 Drawing Sheets

ROTATABLE PICK AND PLACE VACUUM SENSE HEAD FOR DIE BONDING APPARATUS

BACKGROUND OF THE INVENTION

1. Field of the Invention

The subject invention relates to integrated circuit and hybrid microcircuit fabrication apparatus and more particularly to an improved automated apparatus for picking up integrated circuit chips or dies and placing them on a substrate in the course of a die bonding procedure.

2. Description of Related Art

Integrated circuits of very small size are presently handled in so called "waffle packs." Waffle packs are small rectangular trays having a matrix of ridges which typically define square openings wherein an integrated circuit chip or die resides. Such chips may be very small, on the order of 0.010 inch square. Some are so small that the eye can barely detect them.

Apparatus is known which employs automated steps in the transfer of an integrated circuit die or chip from a waffle pack to a substrate. In a subsequent operation, electrical leads are bonded to the die or chip. Since the die or chip is not likely to be properly aligned in the waffle pack, it is necessary to employ some technique of properly aligning the die or chip with respect to the substrate.

Known prior art apparatus uses die squaring fingers or a separate alignment stage in the course of aligning the die or chip. Such systems neither advertise nor guarantee handling of a die smaller than 0.025 mil square. In addition, the separate alignment stage approach requires multiple die handling operations.

Another prior art device, a model 2500 Die Bonder system, manufactured by Hughes Aircraft Company, employs a "chalice" on which a waffle pack is placed under scrutiny of a television camera. The chalice is manually rotated until a selected die under examination aligns with cross hairs on a television monitor viewed by the operator. A mechanical arm is then automatically extended, and a collet with a vacuum needle picks up the die through suction. In this apparatus, a number of collets are rotatably mounted on a ratchet head, which is manually turned to select a needle opening size appropriate to the die being picked up.

The prior art has lacked the capability to automatically rotate a die during transfer from a waffle pack to a substrate. The prior art has also lacked the capability to pick up, rotate, and place a 0.010 inch square ×0.005 inch thick die without damage. Without rotation capability, fully automatic operation of the die bonder system and integration of the system into a robotic system is impossible.

It has been further suggested that rotation of the chip or die could not be incorporated into an embodiment employing a mechanical arm which is extended to pick and place the die or chip. A rationale for such a view is that the dynamics of the arm would be too sensitive to mass, which would have to be increased in such an embodiment. Another concern has been that the increased mass might lead to breakage of the chips.

In addition, in pick and place apparatus, sensing must be provided to determine whether the apparatus has in fact picked up a die. Without such sensing, the collet needle tip can inadvertently be plunged into epoxy on the substrate. Prior art pick and place arms employ a vacuum sensor for this purpose.

Thus, addition of a die rotation capability must also take into consideration and provide proper pickup sensing. It has not been apparent that accurate vacuum pickup sensing can be provided in a system with die rotation capability because of potential sealing problems created by mechanical rotation of parts.

Finally, in addition to the foregoing obstacles, it has appeared desirable to maintain a pick and place accuracy of ±0.001 inches in any such apparatus employing a pick and rotate feature.

SUMMARY OF THE INVENTION

It is therefore a feature of the invention to improve die bonding apparatus;

It is another feature of the invention to provide die bonding apparatus which can rotate a die during transfer to a substrate;

It is another feature of the invention to employ an extendable mechanical arm in such an apparatus;

It is another feature of the invention to provide a die bonding apparatus wherein a collet for a selected die may be automatically picked up by the apparatus;

It is another feature of the invention to achieve a vacuum sensing capability in connection with an apparatus which can rotate a die during transfer to a substrate;

It is another feature of the invention to achieve a vacuum sensing capability in connection with a vacuum collet which is automatically picked up;

It is yet another feature of the invention to provide apparatus with a pick, rotate, and place capability for handling dies as small a 0.010 square and 0.005 thick without damage;

It is yet another feature of the invention to provide a pick, place, and rotate capability which may be integrated into a fully automatic, robotic system.

These and other features, together with attendant advantages, are achieved according to the invention by provision of a rotating pick and place head which can be rotated by associated drive apparatus. A jaw mechanism is built into the rotatable head for automatically picking up and retaining a vacuum collet of selected size. The apparatus further includes sealing and sensing apparatus for accurately sensing when a die has been picked up by the vacuum collet. Rotation of the rotatable head rotates the jaw mechanism and hence, the collet and picked-up die or chip.

In a preferred embodiment, a rotatable pick and place head is rotated by a belt, which is driven by a stepping motor. The pick and place head includes a rotatable spindle which mounts an air cylinder and pickup jaws. The pickup jaws are extended and retracted by the air cylinder. Interchangeable vacuum pickup collets are designed to be positioned by an X-Y table within the pickup jaws and retracted into sealing relation with O-ring seals in the head. The pickup jaws extend to pick up and secure a selected collet in the head, and the O-rings provide a vacuum seal to permit operation of a vacuum sensor system.

DESCRIPTION OF THE PREFERRED EMBODIMENTS

Figure 1:
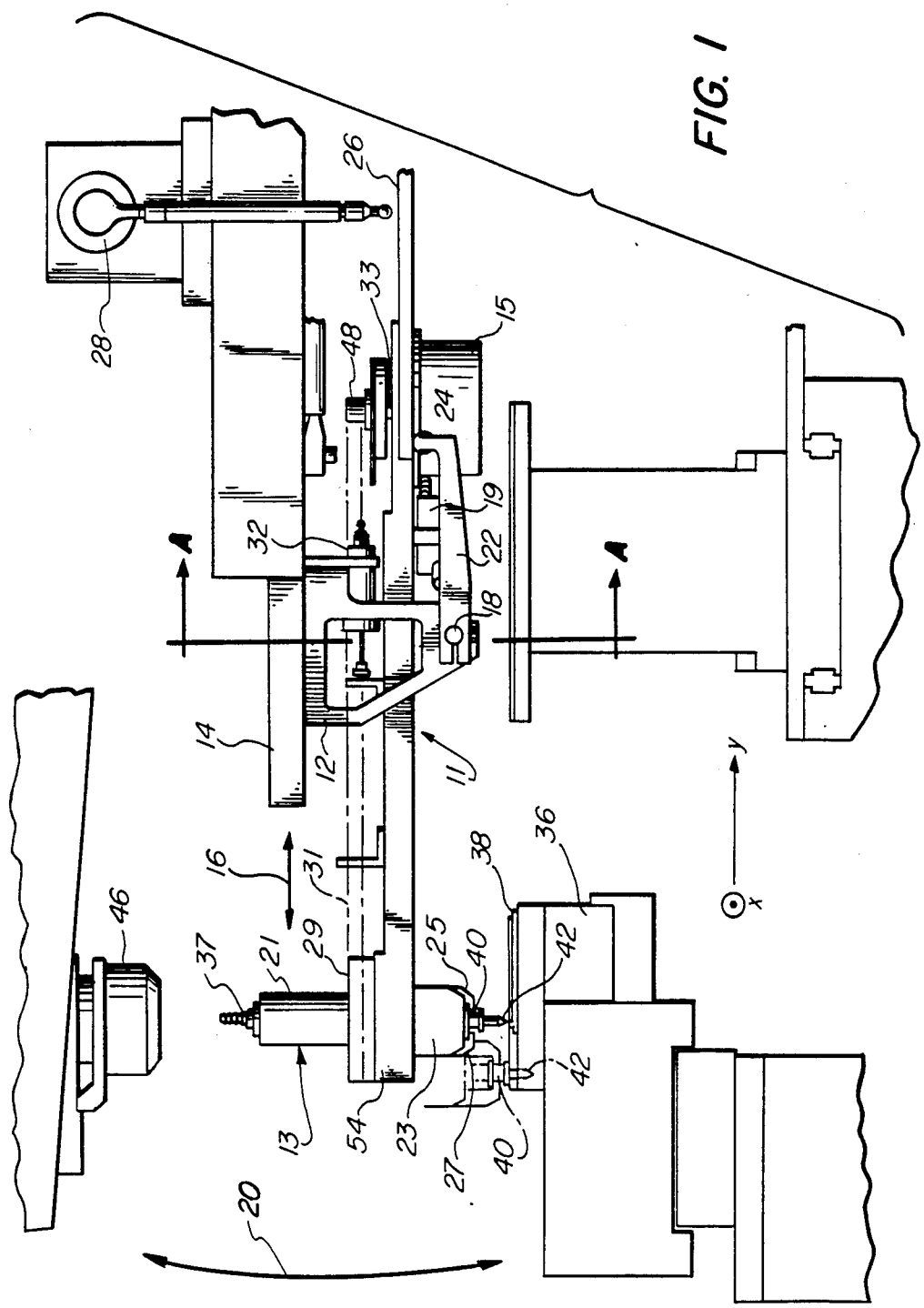
FIG. 1 is a side view illustrating the preferred embodiment of the invention.

FIG. 1 illustrates a side view of a die bonding apparatus employing a rotating pick and place head 13 according to the preferred embodiment.

In FIG. 1, a pick and place arm 11 is shown mounted on a movable carriage 12. The carriage 12 slides in and out of a fixed linear slide 14, as indicated by an arrow 16.

The carriage 12 is also mounted to pivot about a pivot 18, which imparts an arcuate up and down motion to the pick and place head 13, for purposes of raising and lowering the head 13. The pick and place head 13 is illustrated in a lowered position in phantom. Its arcuate up and down motion is illustrated by an arced line 20.

A "z" actuator bar 22 transmits the pivoting drive through the carriage 12 to the pick and place arm 11. The "z" actuator bar 22 mounts a ball bearing 24 on an axis transverse to that of the pick and place head 13. A second horizontal bar 26 is fixed to be driven up and down by an off-center drive crank 28. As the horizontal bar 26 moves downward, it forces the actuator bar 22 to pivot the pick and place arm 11. During this actuation, the actuator ball bearing 24 slides horizontally, parallel to arrow 16, along the undersurface of the horizontal bar 26.

The arcuate up and down motion of the pickup head 13 is dampened by an air pot dampener 32 such that the pickup head 13 descends with a very low force, on the order of a few grams. The foregoing apparatus for moving the arm 11 in and out and in an arcuate up and down motion is commercially available as part of the aforementioned model 2500 Die Bonder, manufactured by Hughes Aircraft Company.

To facilitate picking up various die, an X-Y table 36 is utilized. In FIG. 1, a waffle pack 38 and a collet 40 are illustrated mounted on the X-Y table 36. The X-Y table 36 may be a commercially available model, such as is available from New England Affiliated Technologies, Lawrence, Mass. In FIG. 1, the carriage 12 is illustrated extended in pickup position, such that a needle tip 42 disposed in the pickup collet 40 is centered above a chip to be picked up.

In practice, several waffle packs 38, preferably from four to eight, and a number of collets 40 are mounted on the X-Y table 36. The collets 40 each include a needle tip 42 through which a vacuum is applied to pick up an integrated circuit chip or die.

The waffle pack 38 on the X-Y table 36 is under scrutiny of a television camera 46 which provides an output signal to a digital pattern recognition system, not shown. The pattern recognition system signals the X-Y table 36 to move a selected die or chip to proper pickup position beneath the collet 40 mounted in the pick and place head 13. The pattern recognition system further determines the amount of rotation to be imparted to a picked up chip and controls a stepper motor 15 to appropriately rotate the chip during retraction of the arm 11 from the pickup position, as hereinafter discussed.

The preferred rotary pick and place apparatus includes the pick and place arm 11 to which is mounted the pick and place head 13, the stepper motor 15, and a vacuum sensor 19. The pick and place head 13 includes a rotatable spindle 23 to which are attached an air cylinder 21, pickup jaws 25, 27 and a first timing pulley 29. A continuous belt 31 extends around the first timing pulley 29 and a second timing pulley 48. The second timing pulley 48 is mounted on the drive shaft 33 of the stepper motor 15 at the rear of the pick and place arm 11. The first timing pulley 29 is preferably an eighty (80) tooth pulley while the second timing pulley 48 is a sixteen (16) tooth pulley, such that rotational increments of 1.5 degrees are provided.

Figure 2:
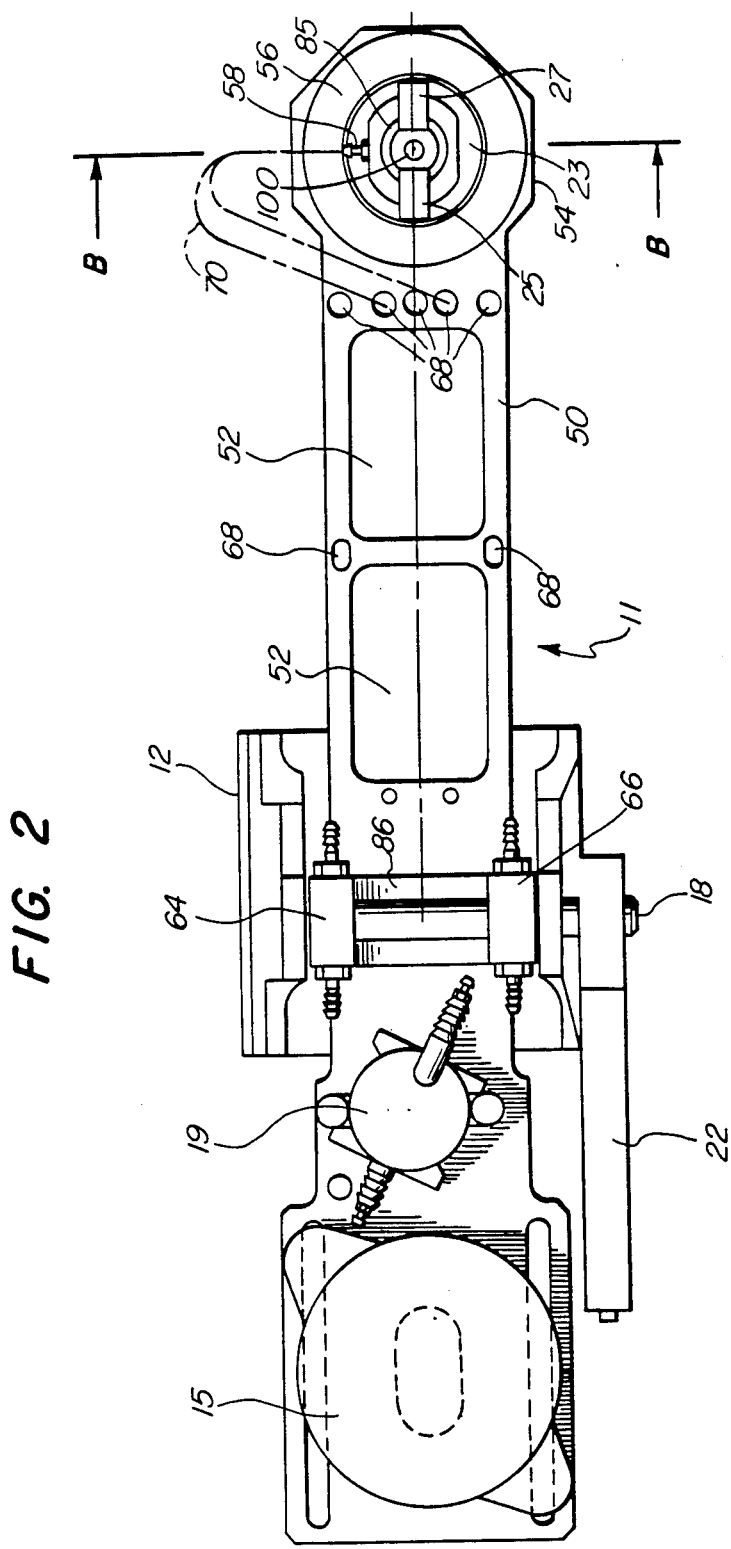
FIG. 2 is a bottom view illustrating the preferred embodiment.

FIG. 2 illustrates the underside of the pick and place arm 11. This view illustrates a unitary frame extension member 50 having openings 52 therein. The frame extension member 50 integrally forms into a mounting head 54. The mounting head 54 is octagonal in cross-section up to its juncture with the extension frame 50.

FIG. 2 also illustrates the underside of the bearing 56, which rotatably mounts the spindle 23 with respect to the mounting head 54. FIG. 2 further illustrates the jaws 25, 27, an O-ring 85, a connection 58 into the port 89 of FIG. 5, and an opening 100 in the spindle 23. This opening 100 receives the collet 40 as hereinafter described in more detail.

The pick and place arm 11 is mounted to the carriage 12 by the pivot 18 previously described. First and second manifolds 64, 66 are mounted on the underside of the arm 11 for conducting pressure lines to the air cylinder port 37 (FIG. 1, FIG. 2) and the vacuum port 87 (FIG. 5) of the pick and place head 13. The vacuum sensor 19 is mounted rearwardly of the manifolds 64, 66 and the carriage 12. Finally, the stepper motor 15 is mounted at the end of the pick and place arm 11 opposite the mounting head 54. The pick and place arm 11 further includes a number of cylindrical apertures 68 through which air lines 70, are wound.

Figure 3:
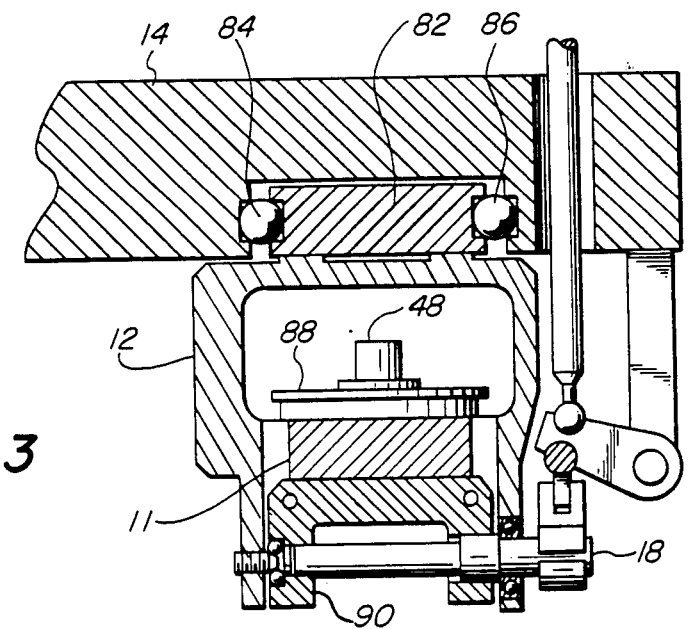
FIG. 3 is a cross-section taken at A—A of FIG. 1.

FIG. 3 further illustrates the carriage 12. The carriage 12 is fixed to a carrier block 82 which rides in and out on interior tracks 84, 86 of the linear slide 14. The carriage 12 mounts a pivot shaft 18. The pivot shaft 18 is fixed to a mounting bracket 90 of U-shaped cross-section, which in turn attaches to the pick and place arm 11. The rear stepper pulley 48 and a sensor flag 88 are also visible in section. The sensor flag 88 is a semicircular metal disc which is fixed to the drive shaft 33 of the stepper motor 15. The sensor flag 88 interrupts an LED light sensor to define initial position for associated control electronics.

Figure 4:
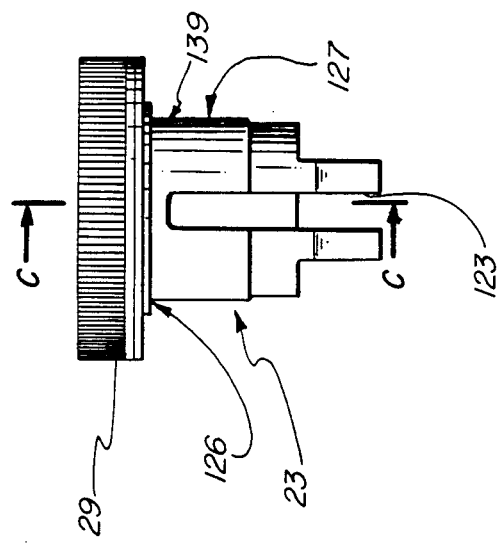
FIG. 4 is a side elevational view of a spindle employing the preferred embodiment.
Figure 5:
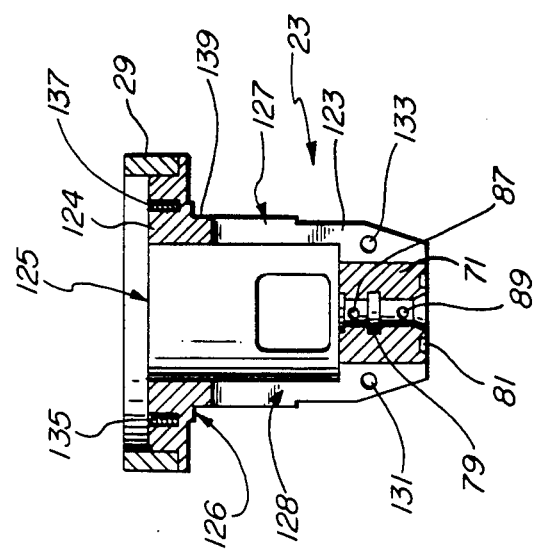
FIG. 5 is a sectional, elevational view of the spindle taken at C—C of FIG. 4.

The rotating spindle 23 of the pick and place head 13 is shown in FIGS. 4 and 5. FIG. 4 shows a side view of the spindle 23 illustrating a first slot 123 wherein one of the jaw members 25, 27 is slidably mounted. The spindle 23 mounts the first pulley 29 on a cylindrical hub 124 (FIG. 5) at its upper end 125. A rim 126 having an annular cross-section is formed by a cylindrical extension below the hub 124. Below the rim 126 is a spindle extension 127 which includes first and second slots 123, 128 for slidably mounting the jaw members 25, 27.

The sectional drawing of FIG. 5 additionally illustrates first and second holes 131, 133 in the first and second slots 123, 128. These holes mount respective pins 52, 62 (FIG. 6) on which the jaw members 25, 27 vertically ride. FIG. 5 further illustrates first and second screw holes 135, 137 in the top portion 125 of the spindle 23. Beneath the rim 126, a second cylindrical segment 139 is provided which is closely toleranced to "push-fit" into a bearing in order to align and retain the spindle 23. The lower end of the spindle 23 embodies a vacuum sensor manifold 71 for receiving the collet 40 and facilitating vacuum pick up and sensing functions. The manifold 71 includes an upper O-ring mounting channel 79 and a lower O-ring mounting channel 81, as well as two ports 87, 89.

Figure 6:
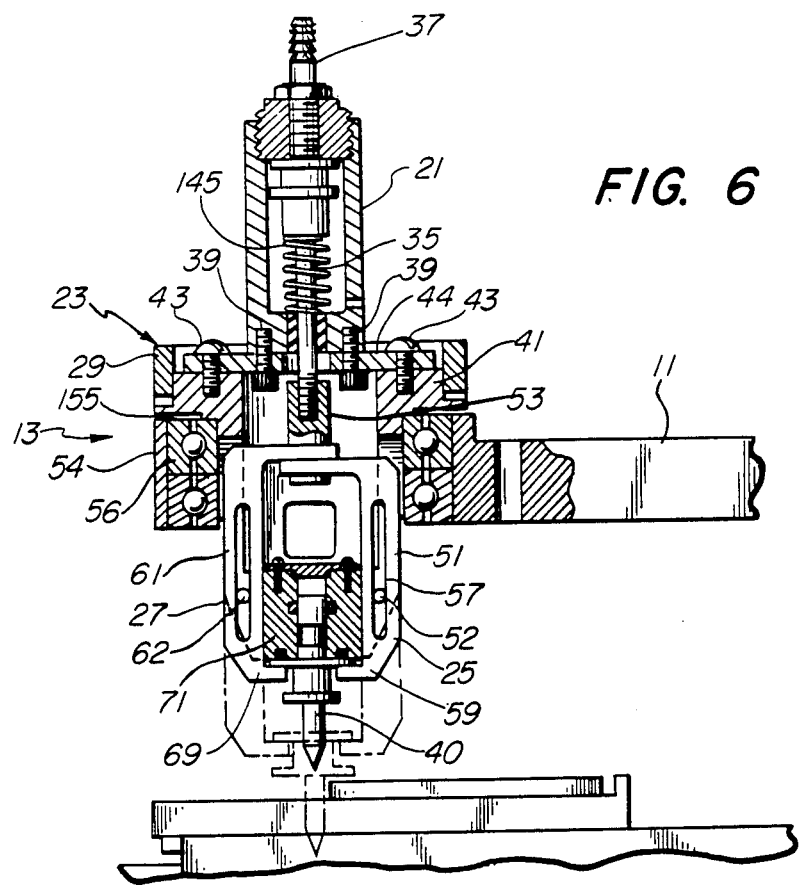
FIG. 6 is a side cross-sectional view illustrating the pick and place head of the preferred embodiment.

A cross-section illustrating the rotary pick and place head 13 is shown in FIG. 6. As previously mentioned, the pick and place head 13 includes the cylinder 21, the spindle 23 and the jaw members 25, 27. The air cylinder 21 is preferably a commercially available part such as Part No. 01.5, manufactured by Bimba Manufacturing Company, Monee, Ill. The air cylinder 21 includes a cylindrical shaft 35 which is forced down in response to application of air pressure through an orifice 37. The shaft 35 is returned by spring bias applied by a spring 145 when air pressure is removed.

The air cylinder 21 is secured to a mounting disc 44 by screws 39. The mounting disc 44 is in turn secured to the spindle 23 by screws 43. The spindle 23 is push-fit into the bearing 56 such that the annular rim of the spindle 23 rests on the top edge 155 of the bearing 56. The bearing 56 may be an ABEC-7 Duplex bearing as available from Fafnir Bearing Division of Textron, Inc., New Britain, Conn. The bearing 56 permits rotation of spindle 23 and, in turn, the air cylinder 21, the jaw members 25, 27 and the collet 40 with respect to the arm 11 in response to rotation of the first pulley 29 by means of the belt 31 (FIG. 1). The spindle 23 is further formed as a unitary hard anodized aluminum part with the outer cylindrical surface 139 which push-fits into the bearing 56 lapped to a tolerance of 0.0001 inches to provide the desired push-fit and precision alignment.

The first jaw member 25 includes an arm 51 attached by a threaded connection member 53 to the shaft 35 of the air cylinder 21. The arm 51 is integrally formed into a vertical extension having a vertical slot 57 therein. The vertical extension is formed into a horizontal gripping hook 59. The vertical motion of the first jaw member 25 is guided by a guide pin 52 which is fixed to the spindle 23 and fits into the vertical slot 57 in the jaw member 25.

Similarly, the second jaw member 27 includes an arm 61 which has a vertical extension which is formed into a second gripping hook 69. The second jaw member 27 is somewhat longer than the first jaw member 25 such that the arm 61 of the second jaw member 27 overlaps the arm 51 of the first jaw member 25, facilitating attachment of the jaw members 25, 27 to the shaft 35 by the connection member 53.

Figure 7:
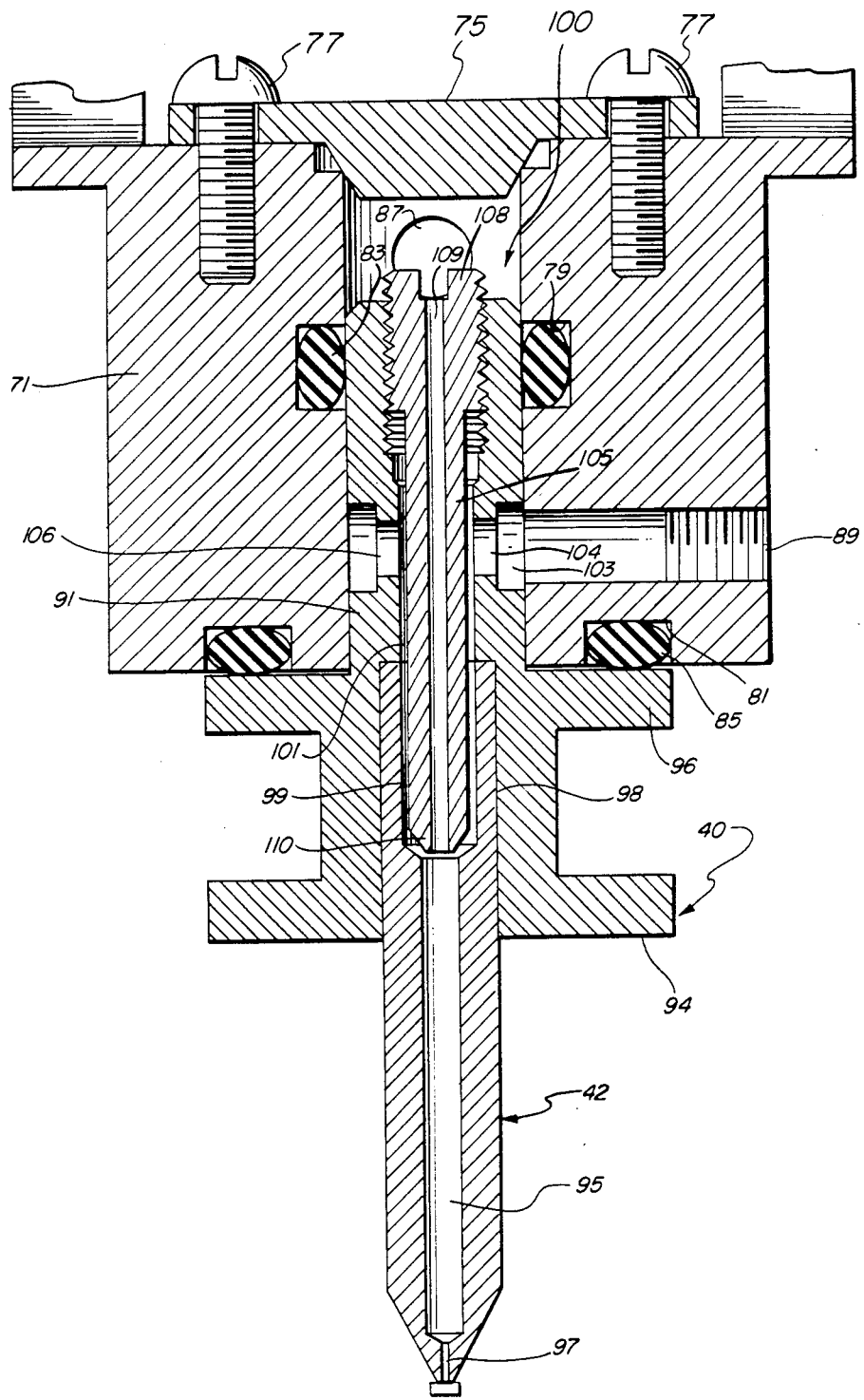
FIG. 7 is a cross-sectional detail of the vacuum manifold and collet according to the preferred embodiment taken at B—B of FIG. 2.

Residing within the jaw members 25, 27 and embodied unitarily as part of the spindle 23 is the vacuum sensor manifold 71, which will now be described in more detail with reference to FIG. 7. The manifold 71 includes first and second mounting slots 81, 79. The first slot 81 is located in the lower face of the housing 73 and is of annular cross-section in a horizontal plane. The second slot 79 is of circular cross-section and formed in an interior cylindrical opening 100 of the manifold 71. The first and second slots 81, 79 mount respective first and second O-rings 85, 83, which may comprise part nos. 2-011, 2-009 as available from Parker Seal Group, Lexington, Ky. The vacuum sensor manifold 71 further includes a vacuum application port 87 for application of vacuum and a vacuum sensor port 89 to facilitate communication with the vacuum sensor 19 (FIG. 2). The vacuum sensor port 89 has been rotated ninety degrees (90°) for purposes of illustration in FIG. 7. The manifold 71 is sealed by a disc seal 75, which seals off the upper end of the interior cylindrical opening 100. The disc seal is held in place by two screws 77.

Cooperating with the vacuum sensor manifold 71 and shown inserted therein in its retracted operative position is the collet 40. The collet 40 includes a collet housing 91 having first and second flanges 94, 96. The collet housing 91 additionally has a cylindrical opening 98 therein wherein the cylindrical upper portion of a needle tip 42 is fixed. The needle tip 42 has a central cylindrical passage 95 therein which leads to a narrow vacuum pickup opening 97, which may be as small as 0.005 inches in diameter. The needle tip 42 has a wider upper cylindrical passage 99 at its upper end. The upper cylindrical passage 99 is frustoconically beveled into the narrower central cylindrical passage 95. Above the needle tip 42, the collet housing 91 has an interior cylindrical passage 101 of diameter substantially equal to that of the upper cylindrical opening 99 of the needle tip 42.

A ring or indentation 103 is formed around the circumference of the collet housing 91 so as to permit the vacuum port 89 to communicate therewith. Cylindrical holes 104, 106 are drilled on a common center line through the ring 103 to provide an air passage into the interior cylindrical passage 101 of the collet housing 91.

Extending into the passage 101 is an adjustment rod 105 which is threadably mounted in the upper end 107 of the collet housing 91. The adjustment rod 105 has a threaded flanged head 108 and a frustoconically beveled tip 110. An interior cylindrical passage 109 extends entirely through the length of the adjustment rod 105. By reason of this construction, the adjustment rod 105 is threadable into the interior cylindrical passage 101, which provides a vacuum adjustment for the vacuum sensing system.

In operation of the disclosed pick and place head, the pick and place arm 11 is first extended with the jaws 25, 27 extended and empty. The pick and place head 13 is then lowered to the position shown in phantom in FIG. 1. The X-Y table 36 then moves a selected collet 40 into the jaws 25, 27. In so doing, the X-Y table 36 locates the collet 40 adjacent the jaws 25, 27 such that the upper flange 96 is at the correct height to move into the jaws 25, 27. The X-Y table then moves transverse to the axis of the pick and place head 13 to move the flange 96 into the jaws 25, 27.

Once the collet flange 96 is within the jaws 25, 27, the air cylinder 21 is actuated to retract the jaws 25, 27 and the collet 40 and set the collet 40 in the vacuum sensing manifold 71. In this manner, the upper end of the collet 40 is pulled toward the manifold 71, and tightly seals against the O-ring 83. At the same time, the upper surface of the collet flange 96 is retracted into a tight seal against the O-ring 85. The adjustment rod 105 has previously been threaded into the interior cylindrical chamber 101 of the collet housing 91 to the proper depth to provide reliable operation of the vacuum sensing system.

The X-Y table then aligns a selected die directly beneath the needle tip 42 of the collet 40 in the pick and place head 13. The "z" actuator bar 22 then lowers the head 13 such that the needle tip 42 is in position to pick up a selected die. Vacuum is then applied through the vacuum application port 87 to pick up the selected die.

When the die is picked up, the vacuum pickup opening 97 is sealed off and vacuum is applied solely to the sensor port 89. The vacuum sensor 19 is connected through a tube to the sensor port 89 and detects the application of vacuum to the port 89 and hence that the die has been picked up. The vacuum sensor 19 also produces a signal if a die or chip is dropped or if the vacuum is otherwise broken.

After the die is secured, it is moved into position for application to a substrate. During this movement, the stepper motor 15 is activated to rotate the die via pulley 29 to proper position as determined by the television pattern recognition system.

The foregoing description has disclosed a preferred embodiment of a pick and place apparatus employing a rotatable head for properly aligning picked-up chips. The spindle of the head is designed to accommodate interchangeable vacuum collets used for picking up and placing a hybrid die or chip. Specially designed jaws assembled in the spindle and actuated by an air cylinder secure the collet into the spindle. Two O-rings within the spindle provide the vacuum seal required to operate the vacuum sensor system.

Various modifications and adaptations of the just described preferred embodiment will be apparent to those skilled in the art from the foregoing disclosure. Therefore, it is to be understood that, within the scope of the appended claims, the invention may be practiced other than as specifically described herein.

What is claimed is:

1. A pick and place apparatus for picking up and placing a die carrying electronic circuitry using collect means having a vacuum pickup, said apparatus comprising:
   spindle means;
   means for rotatably securing said spindle means with respect to said mounting head;
   jaw means for grasping a said collet means; and
   means affixed to said spindle means for slidably extending said jaw means in order to grasp said collet means therein and for thereafter retracting said jaw means and said collet means.

2. The pick and place head of claim 1 further including vacuum sensor manifold means for sealably receiving said collet means upon retracting of said collet means by said jaw means.

3. The pick and place head of claim 2 wherein said manifold means is integrally formed with said spindle means.

4. The pick and place head of claim 1 wherein said means for rotatably securing said spindle means comprises bearing means.

5. The pick and place head of claim 4 wherein said bearing means has a cylindrical opening therein and wherein said spindle means has an outer surface which permits precise fitting, aligning and retaining of said spindle means in said bearing means.

6. The pick and place head of claim 2 wherein said collet means includes flange means graspable by said jaw means and wherein said vacuum manifold means includes a means for sealably engaging said flange means.

7. The pick and place head of claim 6 wherein said collet means further includes a stem on said flange and wherein said vacuum manifold means further includes a means for receiving and sealably engaging said stem.

8. The pick and place apparatus of claim 7 wherein said means for sealably engaging said flange means comprises an O-ring.

9. The pick and place apparatus of claim 8 wherein said means for receiving and sealably engaging said stem includes an O-ring.

10. Pick and place apparatus for picking up and placing an electronic circuit, said apparatus comprising:
    jaw means;
    collet means comprising a flange means graspable by said jaw means;
    means for positioning said collet means within said jaw means;
    means for causing said jaw means to grasp said collet means and retract said collet means and for thereafter rotating said jaw means to position said collet means; and
    vacuum manifold means for receiving the retracted collet means, said vacuum manifold means including means for sealably engaging said flange means.

11. The pick and place apparatus of claim 10 further including a vacuum manifold means for sealably receiving said collet means.

12. The pick and place apparatus of claim 10 wherein said collet means further includes a on said flange and wherein said vacuum manifold means further includes a means for receiving and sealably engaging said stem.

13. The pick and place apparatus of claim 12 wherein said collet means includes interior passage and said stem includes through-passage means leading from outside of said stem into said passage means.

14. The pick and place apparatus of claim 13 wherein said manifold means includes a vacuum port for applying vacuum to said collet means and a second port communicating with said through-passage means.

15. The pick and place apparatus of claim 14 wherein said means for sealably engaging said flange means comprises an O-ring.

16. The pick and place apparatus of claim 15 wherein said means for receiving and sealably engaging said stem includes an O-ring.

17. The pick and place apparatus of claim 10 wherein said means for rotating comprises:
    bearing means; and
    spindle means rotatably secured by said bearing means.

18. The pick and place apparatus of claim 17 further including air cylinder means disposed on said spindle means for extending and retracting said jaw means.

19. Apparatus for picking up and positioning an electronic circuit by means of a collet having a vacuum tube and orifice adapted to secure said circuit, said apparatus including a slidable and pivotable assembly adapted to engage and position said collet, wherein the improvement comprises:
    a rotatable spindle assembly comprising:
       means for permitting rotation of said spindle assembly relative to said slidable and pivotable assembly;
       a plurality of slidable jaw members adapted to engage and secure said collet;
       a vacuum manifold adapted to interface to the vacuum tube of said collet; and
       actuation means for actuating said slidable jaw members to engage said collet.

20. The apparatus of claim 19 wherein said means for permitting rotation of said spindle assembly comprises bearing means.

21. The apparatus of claim 19 wherein said actuation means for actuating said slidable jaw members to engage said collet comprises an air cylinder connected to said slidable jaw members.

22. Apparatus for use with an electronic circuit bonding system for picking up and positioning an electronic circuit by means of a collet having a vacuum tube and orifice adapted to secure said circuit, said apparatus including a slidable and pivotable assembly adapted to engage and position said collet, wherein the improvement comprises:
   a rotatable spindle assembly comprising:
      means for permitting rotation of said spindle assembly relative to said slidable and pivotable assembly;
      a plurality of slidable jaw members adapted to engage and secure said collet;
      a vacuum manifold adapted to interface to the vacuum tube of said collet; and
      actuation means for actuating said slidable jaw members to engage said collet.

23. The apparatus of claim 22 wherein said means for permitting rotation of said spindle assembly comprises bearing means.

24. The apparatus of claim 22 wherein said actuation means for actuating said slidable jaw members to engage said collet comprises an air cylinder connected to said slidable jaw members.

25. Pick and place apparatus for picking up and placing an electronic circuit, said apparatus comprising:
   jaw means;
   collet means graspable by said jaw means for picking up said electronic circuit;
   means including an automated X-Y table for positionable said collet means within said jaw means; and
   means for causing said jaw means to grasp said collet means and for thereafter rotating said jaw means to position said collet means.

26. A pick and place apparatus for picking up and positioning a die comprising electronic circuitry using collet means having a vacuum pickup, said apparatus comprising:
   a mounting head;
   spindle means;
   means for rotatably securing said spindle means with respect to said mounting head;
   jaw means for grasping a said collet means; and
   means affixed to said spindle means including an air cylinder having a shaft connected to said jaw means, said air cylinder being actuatable for slidably extending said jaw means in order to grasp said collet means therein and for thereafter retracting said jaw means and said collet means grasped thereby.

27. The pick and place apparatus of claim 26 wherein said jaw means includes first and second vertically extending portions each having a vertical slot therein, and wherein said spindle means includes first and second guide pins mounted on said spindle means and extending into said guide slots.

* * * * *